(12) United States Patent
Chong et al.

(10) Patent No.: US 9,600,179 B2
(45) Date of Patent: Mar. 21, 2017

(54) ACCESS SUPPRESSION IN A MEMORY DEVICE

(71) Applicant: ARM Limited, Cambridge (GB)

(72) Inventors: Yew Keong Chong, Austin, TX (US); Michael Alan Filippo, Driftwood, TX (US); Gus Yeung, Austin, TX (US); Andy Wangkun Chen, Austin, TX (US); Sriram Thyagarajan, Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/446,668

(22) Filed: Jul. 30, 2014

(65) Prior Publication Data

US 2016/0034403 A1  Feb. 4, 2016

(51) Int. Cl.
| | | |
|---|---|---|
| *G11C 8/08* | (2006.01) | |
| *G06F 3/06* | (2006.01) | |
| *G06F 1/32* | (2006.01) | |
| *G11C 7/00* | (2006.01) | |
| *G11C 7/08* | (2006.01) | |
| *G11C 7/22* | (2006.01) | |

(52) U.S. Cl.
CPC ............. *G06F 3/06* (2013.01); *G06F 1/3275* (2013.01); *G11C 7/00* (2013.01); *G11C 7/08* (2013.01); *G11C 7/22* (2013.01); *G11C 8/08* (2013.01); *Y02B 60/1225* (2013.01)

(58) Field of Classification Search
CPC ............. G06F 12/0897; G06F 12/0811; G06F 12/0831; G06F 12/0804; G06F 12/0862
See application file for complete search history.

(56) References Cited

U.S. PATENT DOCUMENTS 5,367,654 A * 11/1994 Furukawa ................. G06F 9/52
  711/158
5,392,443 A *  2/1995 Sakakibara ......... G06F 15/8076
  708/520

(Continued)

OTHER PUBLICATIONS

UKIPO Search Report; GB 1511055.4; Nov. 25, 2015.

*Primary Examiner* — Mano Padmanabhan
*Assistant Examiner* — Jean Edouard
(74) *Attorney, Agent, or Firm* — Pramudji Law Group PLLC; Ari Pramudji (57) ABSTRACT

A memory device and a method of operating the memory device are provided. The memory device comprises a plurality of storage units and access control circuitry. The access control is configured to receive an access request and in response to the access request to initiate an access procedure in each of the plurality of storage units. The access control circuitry is configured to receive an access kill signal after the access procedure has been initiated and, in response to the access kill signal, to initiate an access suppression to suppress the access procedure in at least one of the plurality of storage units. Hence, by initiating the access procedures in all storage units in response to the access request, e.g. without waiting for a further indication of a specific storage unit in which to carry out the access procedure, the overall access time for the memory device kept low, but by enabling at least one of the access procedures later to be suppressed in response to the access kill signal dynamic power consumption of the memory device can be reduced.

20 Claims, 8 Drawing Sheets

(56) References Cited

U.S. PATENT DOCUMENTS

| | | | | |
|---|---|---|---|---|
| 5,701,434 A * | 12/1997 | Nakagawa | G06F 13/1642 | 711/138 |
| 6,021,461 A | 2/2000 | Dhong et al. | | |
| 7,251,710 B1 * | 7/2007 | Isaac | G06F 12/0862 | 365/49.1 |
| 7,443,759 B1 * | 10/2008 | Rowlands | G11C 7/20 | 365/226 |
| 7,647,452 B1 * | 1/2010 | Moll | G06F 12/0802 | 711/118 |
| 7,873,788 B1 * | 1/2011 | Moll | G06F 12/0862 | 711/118 |
| 7,934,054 B1 * | 4/2011 | Moll | G06F 1/3203 | 345/541 |
| 8,848,412 B1 * | 9/2014 | Yeung | G11C 15/04 | 365/49.1 |
| 2001/0026465 A1 | 10/2001 | Choi et al. | | |
| 2003/0061446 A1 * | 3/2003 | Lee | G06F 12/0864 | 711/128 |
| 2003/0131196 A1 * | 7/2003 | Park | G06F 12/0893 | 711/128 |
| 2004/0024792 A1 * | 2/2004 | Chauvel | G06F 12/0253 | |
| 2005/0240731 A1 * | 10/2005 | Steely | G06F 12/128 | 711/133 |
| 2006/0087882 A1 * | 4/2006 | Kinsley | G11C 7/1045 | 365/185.04 |
| 2006/0226869 A1 * | 10/2006 | Chong | H03K 19/0016 | 326/33 |
| 2006/0291314 A1 * | 12/2006 | Miyamoto | G11C 11/40603 | 365/222 |
| 2006/0294291 A1 * | 12/2006 | Kinsley | G11C 7/1045 | 711/100 |
| 2007/0025172 A1 * | 2/2007 | Miyamoto | G11C 11/406 | 365/222 |
| 2007/0288776 A1 | 12/2007 | Dement et al. | | |
| 2007/0297259 A1 * | 12/2007 | Miyamoto | G11C 11/22 | 365/222 |
| 2009/0019540 A1 * | 1/2009 | Itsik | G06F 21/31 | 726/18 |
| 2009/0144834 A1 * | 6/2009 | Mochizuki | G11C 16/225 | 726/27 |
| 2009/0216979 A1 * | 8/2009 | Balasubramanian | G06F 12/1491 | 711/163 |
| 2011/0072323 A1 * | 3/2011 | Chong | G11C 29/32 | 714/719 |
| 2011/0149674 A1 * | 6/2011 | Yeung | G11C 8/08 | 365/230.06 |
| 2011/0158021 A1 * | 6/2011 | Wiatrowski | G11C 7/12 | 365/203 |
| 2011/0199844 A1 | 8/2011 | Miki et al. | | |
| 2012/0002499 A1 * | 1/2012 | Kinkade | G11C 5/14 | 365/227 |
| 2012/0124318 A1 * | 5/2012 | Bivens | G06F 11/3409 | 711/170 |
| 2012/0155194 A1 * | 6/2012 | Chong | G11C 11/418 | 365/189.11 |
| 2012/0159076 A1 | 6/2012 | Tanpure et al. | | |
| 2012/0170390 A1 * | 7/2012 | Idgunji | G11C 7/222 | 365/194 |
| 2012/0215979 A1 * | 8/2012 | Hunt | G06F 12/0802 | 711/118 |
| 2012/0290780 A1 * | 11/2012 | Kinter | G06F 12/0864 | 711/104 |
| 2013/0166860 A1 * | 6/2013 | Owaki | G06F 12/0607 | 711/157 |
| 2013/0182484 A1 * | 7/2013 | Chong | G11C 5/063 | 365/63 |
| 2013/0191583 A1 * | 7/2013 | Fujimoto | G06F 3/0619 | 711/103 |
| 2013/0318530 A1 * | 11/2013 | Hooker | G06F 9/526 | 718/102 |
| 2014/0063926 A1 | 3/2014 | Lee et al. | | |
| 2014/0181407 A1 | 6/2014 | Crum et al. | | |
| 2014/0241036 A1 * | 8/2014 | Toda | G11C 13/0069 | 365/148 |
| 2015/0149742 A1 * | 5/2015 | Richter | G06F 12/1009 | 711/206 |
| 2015/0155044 A1 * | 6/2015 | Yin | G06F 13/28 | 365/185.24 |

* cited by examiner

ACCESS SUPPRESSION IN A MEMORY DEVICE

BACKGROUND

Technical Field

The present disclosure relates to controlling access to a memory device.

Description of the Prior Art

It is known to provide a data processing apparatus having a memory device which has more than one storage unit in which a data item (having an associated memory address) can be stored. For example, where the memory device is a set-associative cache, a given data item can be stored in any of the multiple ways of the set-associative cache.

In this situation, it is further known for the purposes of reducing the overall access time for the memory device, to initiate a read procedure in each of the multiple storage units of the memory device before it is definitively known in which of those storage units the requested data item is stored. For example, in the context of a set-associative cache for example, it is known to perform a read procedure from all was of the cache and to rely on a tag hit (a match between the memory address of the requested data item and a stored tag portion of the memory address) to select the correct data item from each of the data items read out from the multiple ways. This technique however has the disadvantage that it comes at the price of the additional energy expenditure in performing the read out procedure from the "other" storage units (in which the requested data item is not in fact) in addition to the read out procedure performed for the storage unit in which the data item is in fact stored.

In order to seek to reduce the power consumption of a memory device having multiple storage units, it is further known to seek to predict the storage unit in which a requested data item is stored, so that only that storage unit is then accessed and additional power associated with accessing other storage units in which the data item is not stored is not expended. For example, in the context of the above mentioned set-associative cache, various "way prediction" techniques are known which determine a way in which the requested data item is stored and then only initiate the access with respect to that way. However, these techniques have the disadvantage that the way prediction then adds to the overall time taken for the retrieval of data from the memory, since additional time for the way prediction to complete can delay the start of the memory access.

SUMMARY

Viewed from a first aspect a memory device is provided comprising: a plurality of storage units; and access control circuitry configured to receive an access request and in response to the access request to initiate an access procedure in each of the plurality of storage units, wherein the access control circuitry is configured to receive an access kill signal after the access procedure has been initiated, and the access control circuitry is configured, in response to the access kill signal, to initiate an access suppression to suppress the access procedure in at least one of the plurality of storage units.

The present techniques provide a memory device which facilitates fast access to the memory device by configuring the access control circuitry to initiate an access procedure in each (all) of the multiple storage units in response to an access request that is received (e.g. from a processor seeking access to a data item stored in the memory device). The access request may be a read access request or may be a write access request. However, the dynamic power consumed by the memory device can also be reduced because the access control circuitry can receive an access kill signal after the access procedure has already been initiated and in response thereto suppress the access procedure in at least one of the multiple storage units. Thus, although some dynamic power will already be consumed by the memory device by virtue of the fact that the access procedure has already started, by suppression of the access procedure in at least one of the multiple storage units, for example in all but one of the storage units in which the requested data item is subsequently recognised not to be stored when the storage unit in which the data item is stored has been identified, dynamic power can be saved. Note that the access control circuitry may form a separate component of the memory device from the plurality of storage units providing access control to all storage units or may be distributed across the plurality of storage units providing specific access control to each storage unit.

The suppression of the access procedure could be implemented in a variety of ways, but in some embodiments each of the plurality of storage units comprises wordline circuitry, the wordline circuitry configured to activate a selected wordline in response to the access request as part of the access procedure, and the memory device further comprises wordline suppression circuitry configured to suppress the selected wordline in response to the access kill signal. Hence, where the access procedure is dependent on a selected wordline being activated (e.g. ramped up to a predetermined voltage) further progress of the access procedure can be suppressed by suppressing that selected wordline (e.g. by bringing the selected wordline back to an inactive state (e.g. to a logical zero value)). Suppression of the selected wordline could be implemented in a number of ways, but in some embodiments the wordline suppression circuitry is configured to connect the selected wordline to a fixed voltage in response to the access kill signal. For example, the wordline suppression circuitry can comprise a selectable connection to a voltage rail in the memory device, e.g. the ground (VSS) rail.

Alternatively, or in addition, the suppression of the access procedure can be carried out with respect to sense amplifier circuitry in the memory device and in some embodiments each of the plurality of storage units comprises sense amplifier circuitry, and the memory device is configured to activate the sense amplifier circuitry in response to the access request to perform the access procedure, and the memory device further comprises sense amplifier suppression circuitry configured to suppress the sense amplifier circuitry in response to the access kill signal. The data read out from each storage unit in response to a read access request is typically generated by sense amplifier circuitry which is usually activated once the bit lines in the storage unit have discharged to the point at which it is possible for the sense amplifier circuitry to determine a stored data value from a voltage difference between those bitlines, and use of the sense amplifier circuitry to generate the output data value generally represents a significant proportion of the dynamic power consumed by the storage unit in carrying out the access procedure (in part as well because the changing data value also causes output drivers to toggle). Suppression of the sense amplifier circuitry thus can avoid the expenditure of this dynamic power, in particular if an access kill signal can be acted upon before the sense amplifier circuitry is even activated.

The sense amplifier suppression circuitry could suppress the sense amplifier circuitry in a number of ways, but in some embodiments the sense amplifier circuitry is configured to be activated when a sense amplifier enable signal is asserted, and the sense amplifier suppression circuitry is configured to connect the sense amplifier enable signal to a fixed voltage in response to the access kill signal. Where the sense amplifier circuitry requires the enable signal to be asserted in order to be active, coupling the enable signal to a fixed voltage (e.g. to ground when the sense amplifier enable signal is active high or to a logical high value when the sense amplifier enable signal is active low) can effectively disable the sense amplifier circuitry and prevent any significant further dynamic power being expended by the operation of the sense amplifier circuitry.

The memory device could take a variety of forms, but in some embodiments the memory device is a first level cache providing in association with the data processor. It is typically required for a response from a first level cache to be received very quickly and it is beneficial therefore for this responsiveness not to be delayed by uncertainty about the precise storage location (e.g. in which way of a set associative cache) of the accessed data item, as is supported by the present techniques.

The plurality of storage units could take a number of forms, but in some embodiments the memory device is a multi-way set-associative cache and the plurality of storage units are a plurality of ways of the multi-way set-associative cache. Storage of a data item in a memory device which is multi-way set-associative in this manner could take place in any one of the multiple ways, but which way a particular data item is stored in is generally not known when the access request is first received by the memory device, unless provision of the access request has been delayed whilst some variety of way prediction is carried out. The present techniques enable an undelayed access request to be provided to the memory device, but nevertheless to benefit from a late kill signal received later by the memory device (such as a predicted way signal), and therefore nevertheless to reduce the dynamic power consumption of the memory device.

In a multi-way set-associative cache the access suppression could be implemented in a number ways, but in some embodiments each way of the plurality of ways comprises a tag storage unit and a data storage unit and the access control circuitry is configured to initiate the access suppression in at least one tag storage unit of the plurality of storage units. Accordingly, where tag retrieval and comparison (against at least a portion of the memory address of the access request to be carried out) is performed, a dynamic power saving can be achieved by suppressing the part of the access procedure carried out in at least one tag storage unit.

Alternatively, or in addition, in some embodiments each way of the plurality of ways comprises a tag storage unit and a data storage unit and the access control circuitry is configured to initiate the access suppression in at least one data storage unit of the plurality of storage units. Where data items from a number of was are initially retrieved as part of the access procedure, dynamic power can be saved by suppressing the retrieval of a data item from at least one data storage unit.

In some embodiments the access control circuitry is configured to generate an internal clock signal in each of the plurality of storage units to control timing of the access procedure, and the access control circuitry is configured to initiate the access suppression after a first edge of the internal clock signal has been generated. Where an internal clock signal is generated for each storage unit to control the timing of the access procedure, and for example a first edge (e.g. rising edge) of the internal clock signal typically signals the start of the access procedure in the storage unit, it is beneficial if the access suppression can begin even after this point (i.e. that the access procedure initiated after the first edge of the internal clock signal is not atomic and can in fact be interrupted) since this provides the opportunity for dynamic power saving even at this relatively late stage.

In some embodiments each of the plurality of storage units comprises bitline precharge circuitry, wherein the bit line precharge circuitry is configured to precharge bitlines in that storage unit before the access procedure is initiated, and the access procedure comprises discharging the bitlines, and the access control circuitry is configured to initiate the access suppression after discharging the bitlines has started. It is also beneficial for the access suppression to be able to be initiated even after the discharging of the bit lines has started, in that although a small amount of dynamic power will be consumed by this partial bit line discharge, further dynamic power can be saved by being able to intervene to initiate the access suppression after this has already started and thus prevent further discharge of the bit lines and the dynamic power associated therewith.

In some embodiments the access control circuitry is configured to receive a chip enable signal for the memory device, the access request comprises assertion of the chip enable signal and the access control circuitry is configured to initiate the access procedure in response to assertion of the chip enable signal. The use of a chip enable signal, in particular asserted by a processor as part of the access request, may represent a critical path within a CPU which comprises the processor and the memory device (e.g. a level 1 cache) and initiating the access procedure (directly) in response to the assertion of the chip enable signal prevents this CPU critical path timing from being affected.

The access kill signal could take a number of forms, but in some embodiments, where the memory device is a multi-way set-associative cache, the access control circuitry is configured to receive, as the access kill signal, a way prediction signal indicating a subset of the ways, and the access control circuitry is configured to initiate the access suppression to suppress the access procedure in the subset of was indicated by the way prediction signal. The way prediction signal may be a positive identification of a way in which the requested data item is expected to be stored, in which case the access procedure is then suppressed in all other ways, or alternatively the way prediction signal could comprise an indication of one or more of the ways in which it is known that the requested data item is not stored and in this case the access procedure is suspended in those identified ways.

The access kill signal may directly indicate one or more of the storage units in which the access suppression should take place (either by the storage unit deselection signal directly indicating the storage units in which the access suppression should take place or by indicating the storage units in which the access procedure should continue (and by inference indicating that the access should be suppressed in the remainder)). Accordingly, in some embodiments, the access control circuitry is configured to receive, as the access kill signal, a storage unit deselection signal indicating a subset of the plurality of storage units, and the access control circuitry is configured to initiate the access suppression to suppress the access procedure in the subset of the plurality of storage units indicated by the storage unit deselection signal.

In some embodiments the access request is a read access request and the access procedure is a read access procedure.

In some embodiments the access request is a write access request and the access procedure is a write access procedure.

Viewed from a second aspect a method of operating a memory device is provided comprising:
storing data in a plurality of storage units;
receiving an access request; in response to the access request, initiating an access procedure in each of the plurality of storage units; receiving an access kill signal after the access procedure has been initiated; and in response to the access kill signal, suppressing the access procedure in at least one of the plurality of storage units.

Viewed from a third aspect a memory device is provided comprising a plurality of means for storing data; means for receiving an access request; means for, in response to the access request, initiating an access procedure in each of the plurality of means for storing data; means for receiving an access kill signal after the access procedure has been initiated; and means for, in response to the access kill signal, suppressing the access procedure in at least one of the plurality of means for storing data.

BRIEF DESCRIPTION OF THE DRAWINGS

The present invention will be described further, by way of example only, with reference to embodiments thereof as illustrated in the accompanying drawings, in which.

DESCRIPTION OF EXAMPLE EMBODIMENTS

Figure 1:
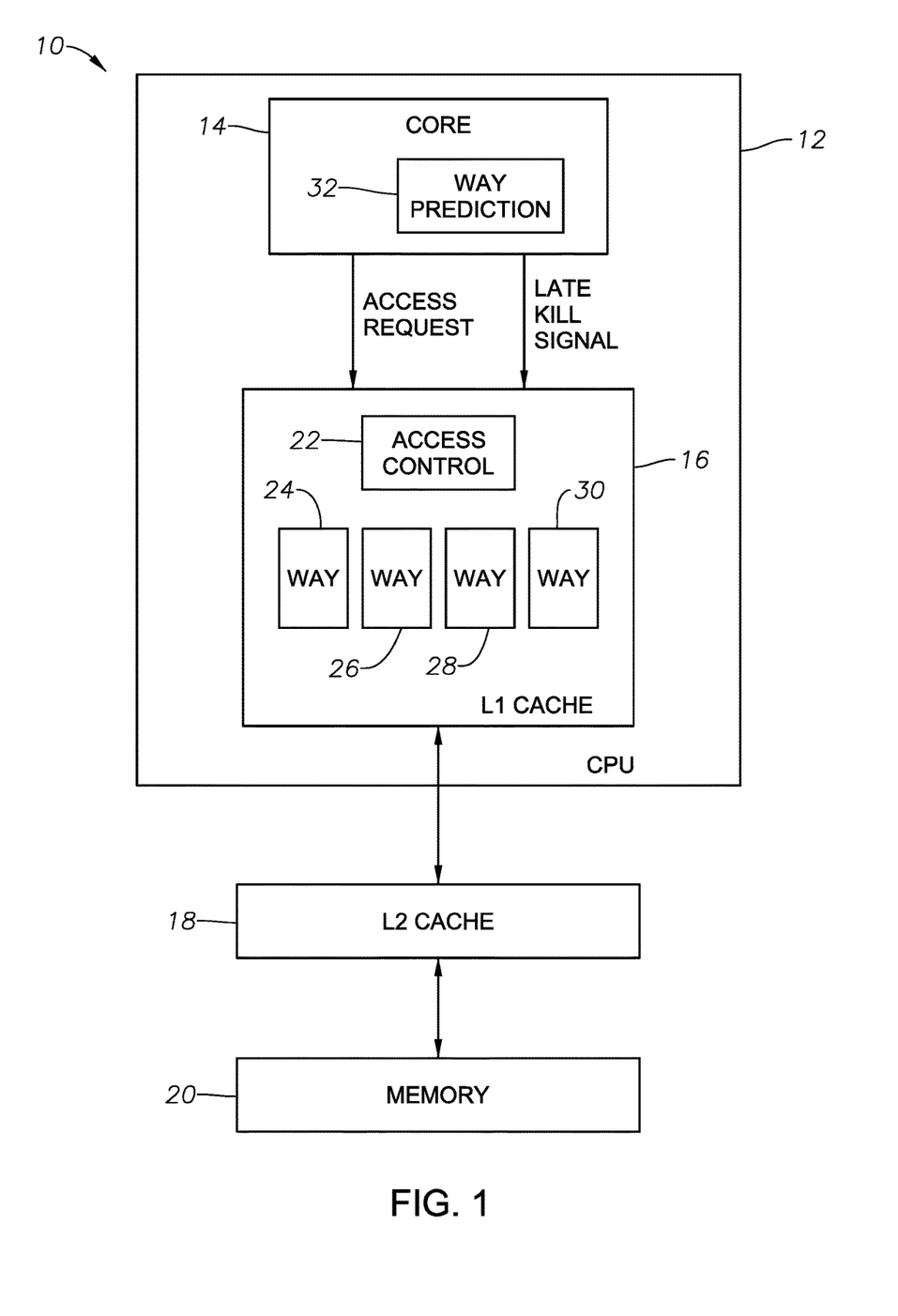
FIG. 1 schematically illustrates a data processing system comprising a memory device in one embodiment.

FIG. 1 schematically illustrates a data processing apparatus 10 in one embodiment. The data processing apparatus 10 comprises a central processing unit (CPU) 12, which itself comprises a processor core 14, a level 1 (L1) cache 16, a level 2 (L2) cache 18 and an external memory 20. Data items are stored in the external memory 20 to which the processor core makes access as part of its data processing operations. In order to reduce the access latency to the memory 20, the L1 cache 16 and L2 cache 18 are provided to store copies of data items accessed by the processor core 14. The access latency of the L1 cache 16 is rather shorter than that of the L2 cache 18, but the storage capacity of the L2 cache 18 is also larger, in a manner with which one of ordinary skill in the art will be familiar.

When the processor core 14 requires access to a data item, whether that access is a read access or a write access, it issues an access request (a read access request or a write access request) which is first received by the L1 cache 16. If the requested data item is not present in the L1 cache 16 the access request is forwarded to the L2 cache 18 and if it is not stored there it is forwarded to the external memory 20. Again, one of ordinary skill in the art will be familiar with this use of a memory hierarchy. When the data item is stored in the L1 cache 16 the data item is accessed under control of the access control circuitry 22. In this embodiment the L1 cache 16 is a set-associative cache comprising four ways 24, 26, 28, 30. In order to keep the overall access time of the L1 cache 16 low, the access control circuitry 22 is configured to initiate the access (whether a read access or a write access) to the ways 24, 26, 28, 30 directly in response to the reception of the access request. However, the L1 cache 16 is also configured to receive an addition signal from the core 14, after the access request has already been sent, namely the "late kill signal", in response to which the access control circuitry 22 is configured to suppress (i.e. stop) the access procedure which has already been initiated in one of the ways 24, 26, 28, 30. This is described in more detail with reference to the following figures.

The processor core 14 is configured to generate the late kill signal on the basis of a way prediction generated by way prediction 32. It should be noted that in this embodiment the way prediction 32 represents a function carried out by the core 14 rather than a specific physical sub-component within the core 14, although such a configuration is also contemplated. The way prediction generated by way prediction 32 and determining the late kill signal may be an explicit indication of the way in which the requested data item is expected to be stored, in which case the access control circuitry 22 is configured to cause the access procedure already initiated in all the other ways to be suppressed, or the way prediction may be an indication of at least one way in which it is predicted that the requested data item is not stored, in which case the access control circuitry 22 is configured to suppress the access procedure already initiated in those ways. It should also be noted that although the way prediction 32 may in principle be capable, with sufficient time available, to accurately predict which way of the L1 cache 16 of the requested data item is stored in, in order to maintain the overall access time of the L1 cache 16 at the above-mentioned low level, the processor core 15 can be configured to generate the late kill signal before the way prediction 32 has completed it prediction process, so that the access suppression within the L1 cache 16 can be triggered earlier enough to gain the benefit of a dynamic power reduction, even though this may then involve the access suppression being carried out in only a limited number of the ways (i.e. in fewer than N–1 ways where N is the total number of ways in the L1 cache 16). This may for example be appropriate in the context of a complex instruction being executed by the processor core 14 which requires a memory access to be carried out, but where the complexity of the instruction (for example requiring multiple derivative items of information) is such that the way prediction will take commensurately longer to be carried out.

Figure 2:
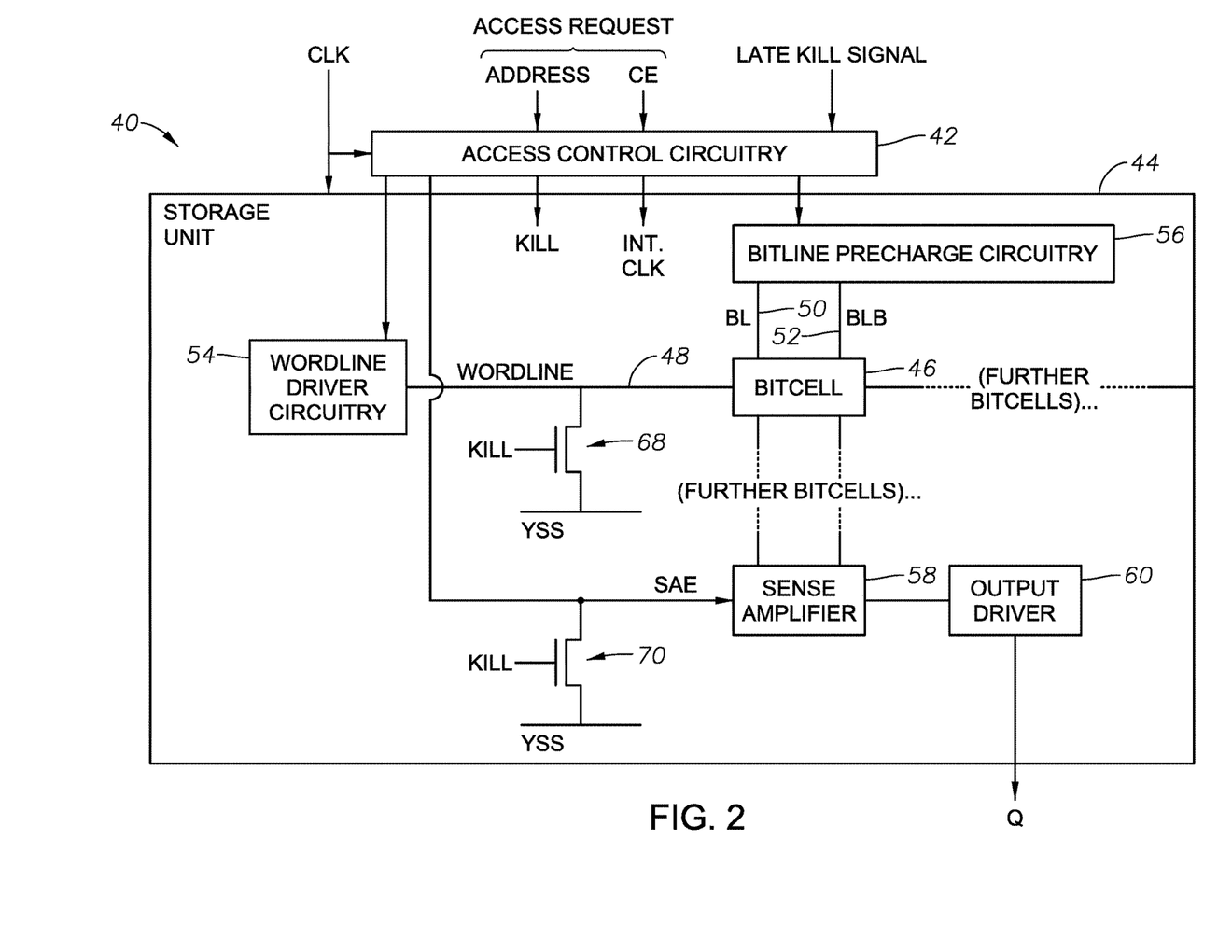
FIG. 2 schematically illustrates in more detail the configuration of a memory device in one embodiment.

FIG. 2 schematically illustrates in more detail the configuration of a memory device 40 in one embodiment, which may for example correspond to the L1 cache 16 shown in FIG. 1. The memory device 40 comprises access control circuitry 42 and several storage units, of which only one storage unit 44 is illustrated in FIG. 2. The storage unit 44 comprises a number of bit cells, each configured to store an individual bit value. In a manner with which one of ordinary skill in the art will be familiar, these bit cells are typically arranged in a large array, but for clarity of illustration only a single bit cell 46 is explicitly shown in FIG. 2. Access to the content of the bit cell 46 takes place using an associated wordline 48 and an associated pair of bit lines BL 50 and BLB 52. The wordline 48 is controlled by wordline driver circuitry 54, whilst precharging of the bit lines BL 50 and BLB 52 is provided by the bit line precharge circuitry 56. Reading out of the content of the bit cell 46 via the bit lines BL 50 and BLB 52 is carried out by the sense amplifier 58 which generates a data value in dependence on the relative voltages sensed on the pair of bit lines and passes this data value to the output driver 60 which provides this as the output data value Q.

The access control circuitry 42 is configured to receive the access request, which in this illustrated example is a read access request, where the access request comprises both the address of the requested data item, and a chip enable signal CE. The access control circuitry 42 is configured to initiate the access procedure in the storage unit 44 (and in the other storage units provided in the memory device 40) directly upon receipt of the asserted CE signal. Accordingly, the usual timing of this CE signal can be maintained and as such (generation and assertion of this CE signal being a critical path for the CPU) the timing of the issuance of the read access request is not affected by the present techniques. The access control circuit 42 is configured to cause the bit line precharge circuitry 56 to pre-charge the bit lines BL 50 and BLB 52 and indeed this may take place before the access request is received such that the time associated with pre-charging these bit lines is not incurred as part of the access latency. When the access procedure is initiated by the access control circuitry 42, the access control circuitry 42 causes the wordline driver circuitry 54 to assert the wordline 48 and the voltage of the wordline 48 thus begins rising. The access control circuitry 42 also generates an internal clock signal which initiates the access procedure in a storage unit 44. This is dependent on an external clock signal CLK for the memory device which is received by both the access control circuitry 42 and the storage unit 44 to control and coordinate the overall timing of these components.

Once the wordline driver circuitry 44 has brought the wordline 44 up to a sufficient voltage, the coupling that this asserted wordline 48 causes between the bit cell 46 and the bit lines BL 50 and BLB 52 causes the bit lines to begin discharging. Once this discharge has had time to progress significantly then the access control circuitry 42 is configured to assert a sense amplifier enable signal SAE (which in this illustrated embodiment is active high) in order to cause the sense amplifier 58 to determine the value stored in the bit cell 46 by comparison of the relative voltages on the two bit lines. However, the access control circuitry 44 is also configured to receive a late kill signal from the processor which issues the access request and in response to this to generate a the KILL signal which is passed to the storage unit 44. This kill signal KILL provides the switching signal for both the gate 68 coupled to the wordline 48 and to the gate 70 coupled to the SAE path. When the kill signal is asserted then both the wordline 48 and the SAE path are rapidly pulled down to VSS (ground) such that both are forced into an inactive state. This suppresses the access procedure in the storage unit 44. The late kill signal may be for example be a way prediction signal, when the storage unit 44 is a way of a set associative cache, as in the example illustrated in FIG. 1. However, the late kill signal may also be an direct indication of a subset of the storage units in the memory device 40, indicating in which storage unit or storage units the already-initiated access procedure should be suppressed.

Figure 3:
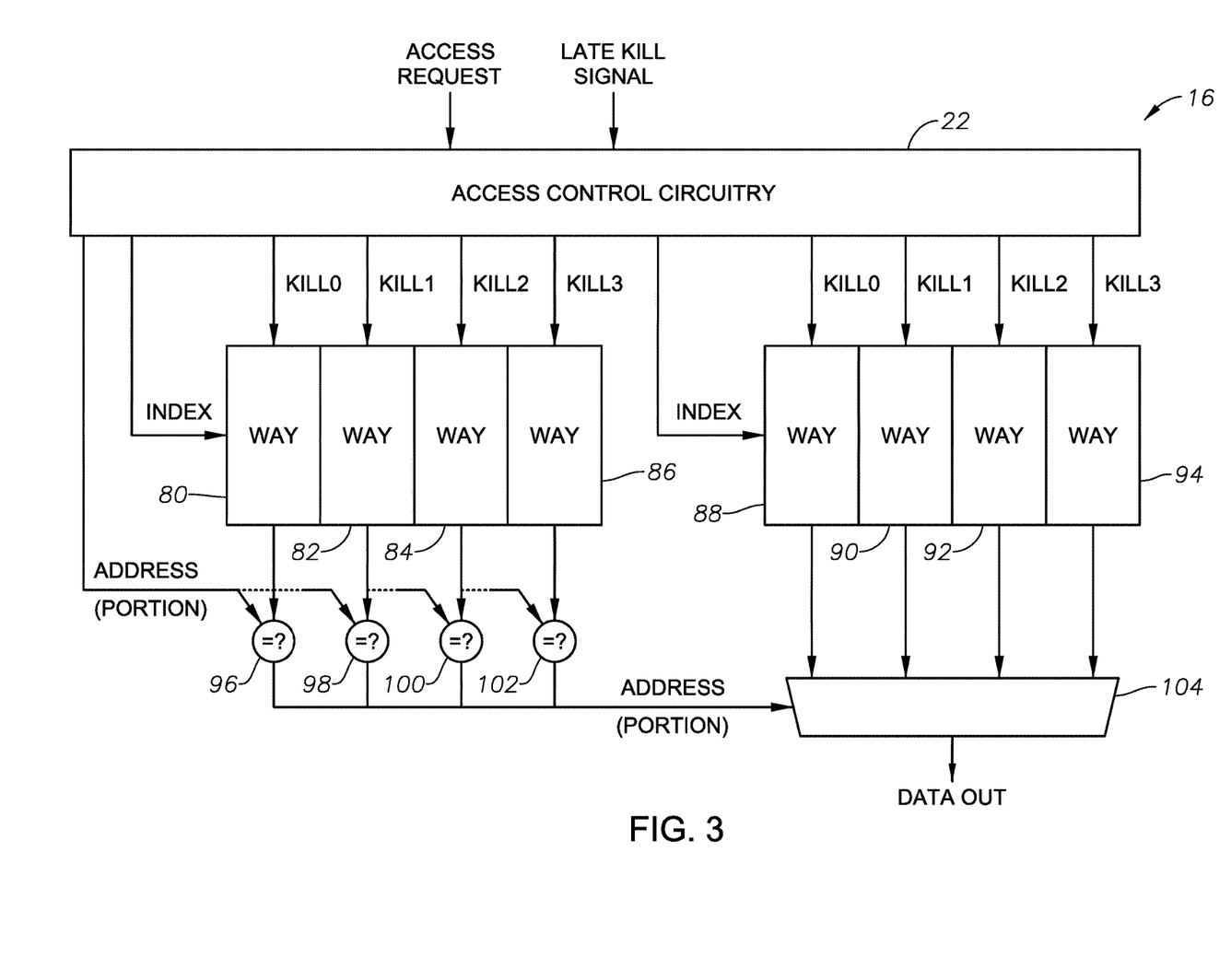
FIG. 3 schematically illustrates the configuration of a multi-way set-associative cache providing the memory device in one embodiment.

FIG. 3 schematically illustrates in more detail the configuration of a set-associative cache such as the L1 cache 16 in the embodiment shown in FIG. 1. The ways of the set associative cache comprise a set of tag RAMs 80, 82, 84, 86 and a set of data RAMs 88, 90, 92, 94. When the access procedure is initiated in this set-associative L1 cache 16, an index is generated by the access control circuitry 22 which is passed both to the tag RAMs and to the data RAMs. In the event that no late kill signal is yet received by the access control circuitry, then a corresponding entry is read out from each of the tag RAMs 80, 82, 84, 86 and from each of the data RAMs 88, 90, 92, 94. The address of the access request (or at least a portion thereof) is compared to the entry read out from each of the tag RAMs by the comparators 96, 98, 100, 102 and the entry that matches the address (or at least a portion thereof) is passed to the multiplexer 104, providing its selection signal. In this manner the corresponding entry read out from the data RAM in the same way as the tag RAM providing the address match is selected to be provided as the output data.

However, when the late kill signal is received by the access control circuitry 22 after the access procedure has already been initiated in the tag RAMs and data RAMs, the access control circuitry 22 is configured to assert a kill signal in the deselected way or ways, this being provided by at least one of the respective kill signals kill0, kill1, kill2, kill3. In this manner the access procedure in the respective tag RAM and data RAM of a deselected way is suppressed. This can be implemented as shown in FIG. 2.

Figure 4:
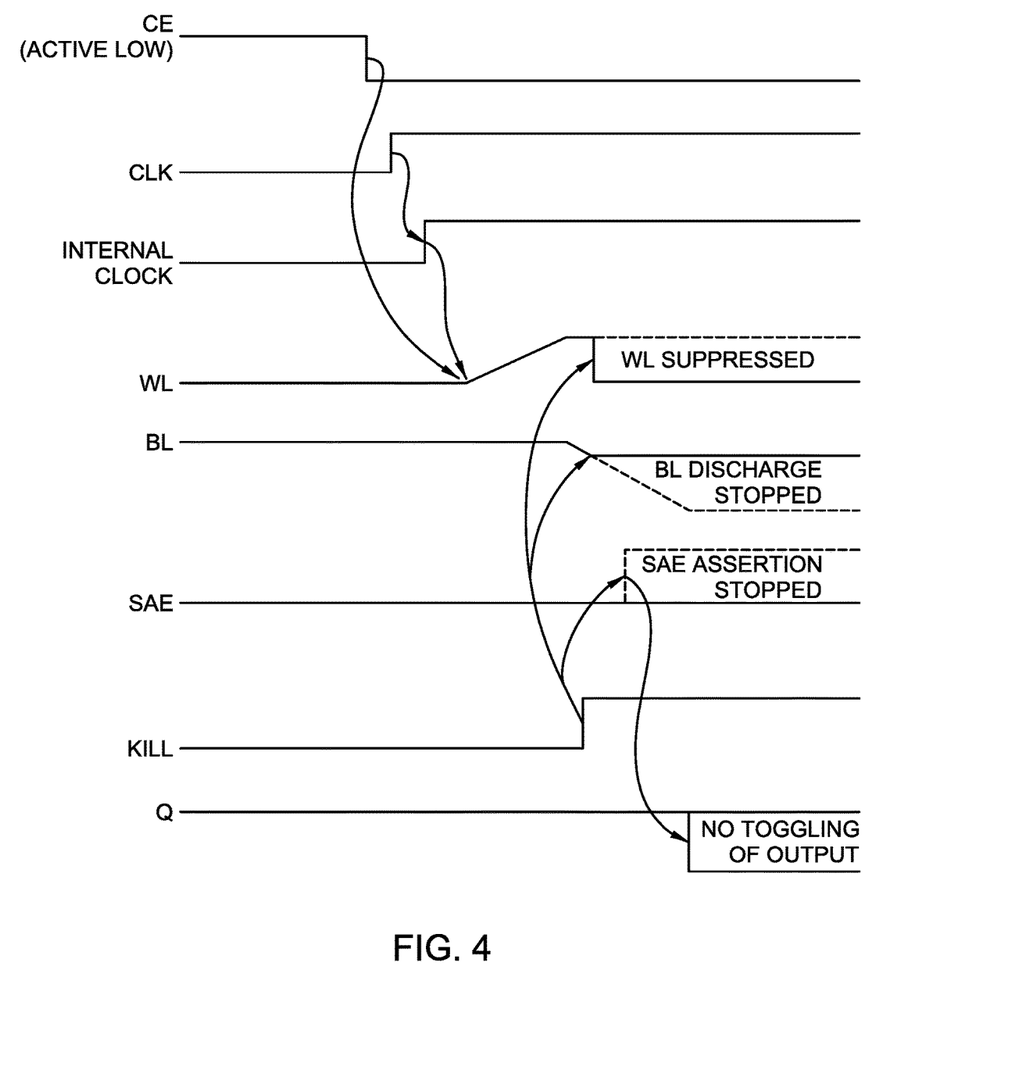
FIG. 4 shows example timings within a memory device in one embodiment.

FIG. 4 shows example timings of various signals in an embodiment such as that illustrated in FIG. 2. In response to the activation (low) of the chip enable signal CE, following the rising edge of the main clock signal CLK a rising edge of the internal clock signal is generated for each storage unit initiating the access procedure in the respective storage units. The appropriate word line WL (in dependence on the address indicated in the access request) then begins to ramp up and once it has reached a sufficient voltage the hit lines begin discharging (only the voltage on one bit line BL is shown in figure). Shortly after this the late kill signal is received by the access control circuitry 22, causing the KILL signal to be asserted in this storage unit. Assertion of this KILL signal pulls both the word line signal WL and the sense amplifier enable signal SAE down to ground, thus suppressing further progress of the access procedure in this storage unit. Note that in fact by the point that the KILL signal is asserted, the sense amplifier enable signal SAE had not yet been asserted, but the figure illustrates (by means of the dashed line) how SAE would have been asserted had the KILL signal not been asserted at all. The suppression of the word line signal WL and in particular the suppression of the activation of the SAE signal prevents further dynamic power from being consumed. Note also that as a result of the SAE signal not been asserted no toggling of the output driver occurs, also saving dynamic power.

Figure 5A:
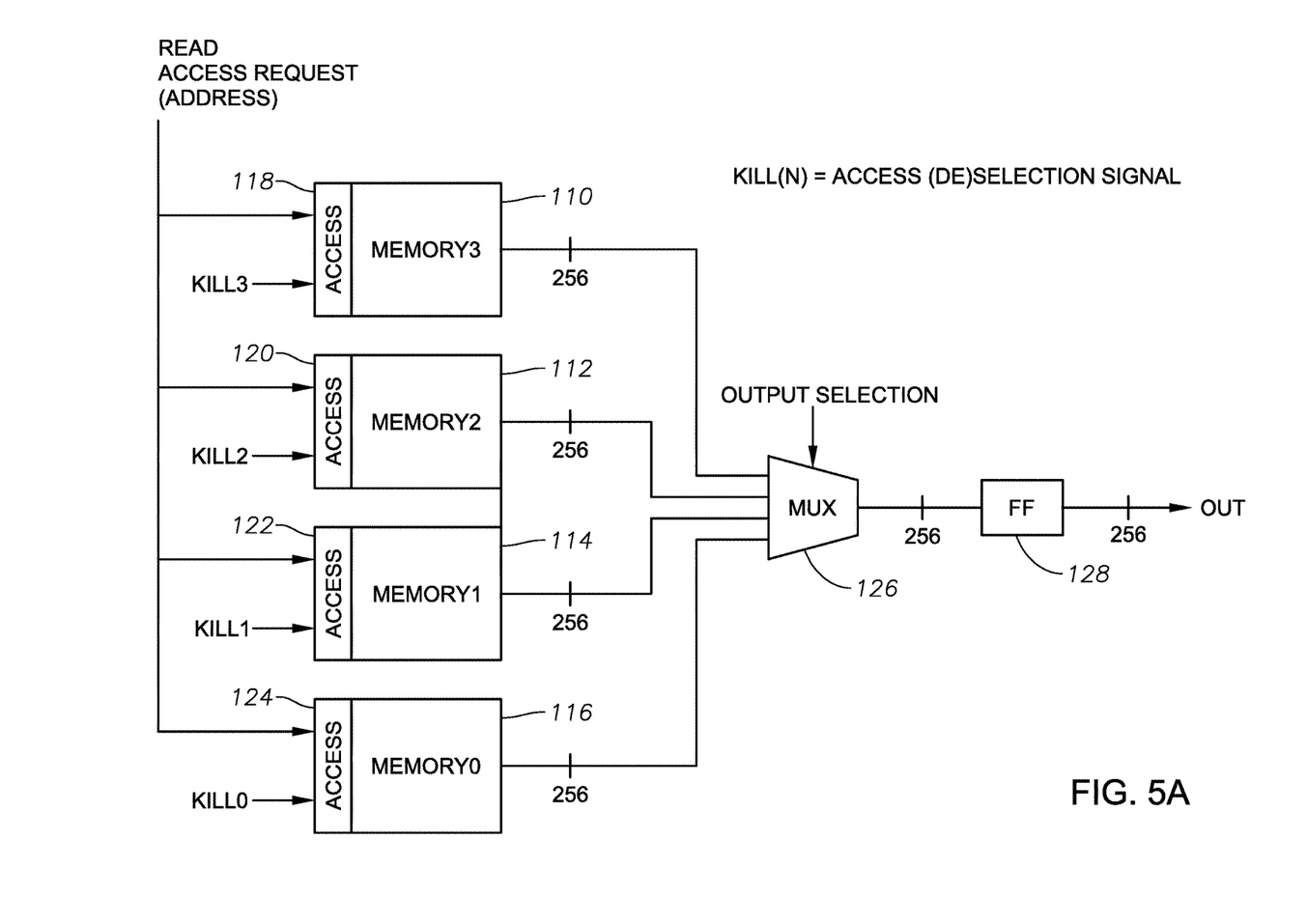
FIG. 5A schematically illustrates a memory device in one embodiment in which access suppression to suppress a read access procedure is carried out.
Figure 5B:
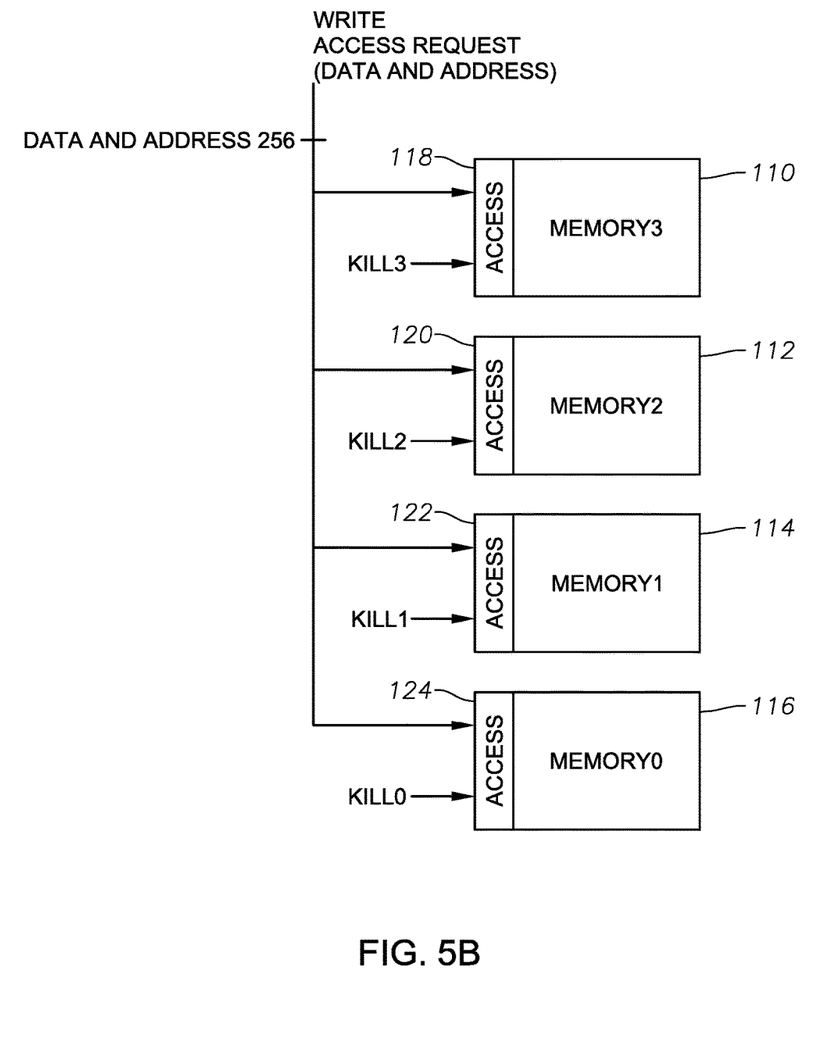
FIG. 5B schematically illustrates a memory device in one embodiment in which access suppression to suppress a write access procedure is carried out.

FIGS. 5A and 5B illustrate configurations in which, respectively, a read access request and a write access request are received by the memory device. The set of storage units (memory3-memory0) 110, 112, 114, 116 in the example of FIG. 5A are distinct storage units in which a data item is stored in multiple storage units for reasons of redundancy, but could also for example be the ways of a set-associative cache. In the configuration illustrated in FIG. 5A the read access request is received by the access control circuitry 118, 120, 122, 124 of the set of storage units 110, 112, 114, 116. Note therefore that in this embodiment the access control circuitry forms part of each storage unit, rather than being a separate single components providing access control to all storage units. Without the late kill signal being asserted, which in this case is an access deselection signal indicating specific storage units in which the read access procedure should be suppressed, all of the storage units could in principle output the 256-bit data value (assuming that the data value was stored in all four storage units for multiple redundancy). An output multiplexer 126 then selects between these outputs dependent on an output selection signal and this output data value is then latched in the flip-flop 128 before then provided as the final output data value. The late kill signal is provided to each of the storage units as an individual late kill signal kill3-kill0, and when at least one of these late kill signals is asserted, the read access procedure in that storage unit is suppressed. Conversely, in the embodiment illustrated in FIG. 5B when the access request is a write access request, the write access request comprises both a 256-bit data value to be written and its corresponding memory address. The write access request may also comprise an indication of particular storage units in which the data value should be written, or this indication may be omitted indicating that for full redundancy the data value should be written in all storage units. Multiple write access procedures are then initiated in response to the write access request, but in response to at least one of the individual late kill signals kill3-kill0, at least one of the write access requests is suppressed. Additionally the access control circuitry 118, 120, 122, 124 of the set of storage units 110, 112, 114, 116 may be configured to only act on the kill signals kill3-kill0 if they are received before a predetermined stage of the initiated multiple write access procedures, to prevent the content of the bitcells being written being left in an indeterminate state, where it is unclear whether a bit of the received data value has or has not been updated in its bitcell.

Figure 6:
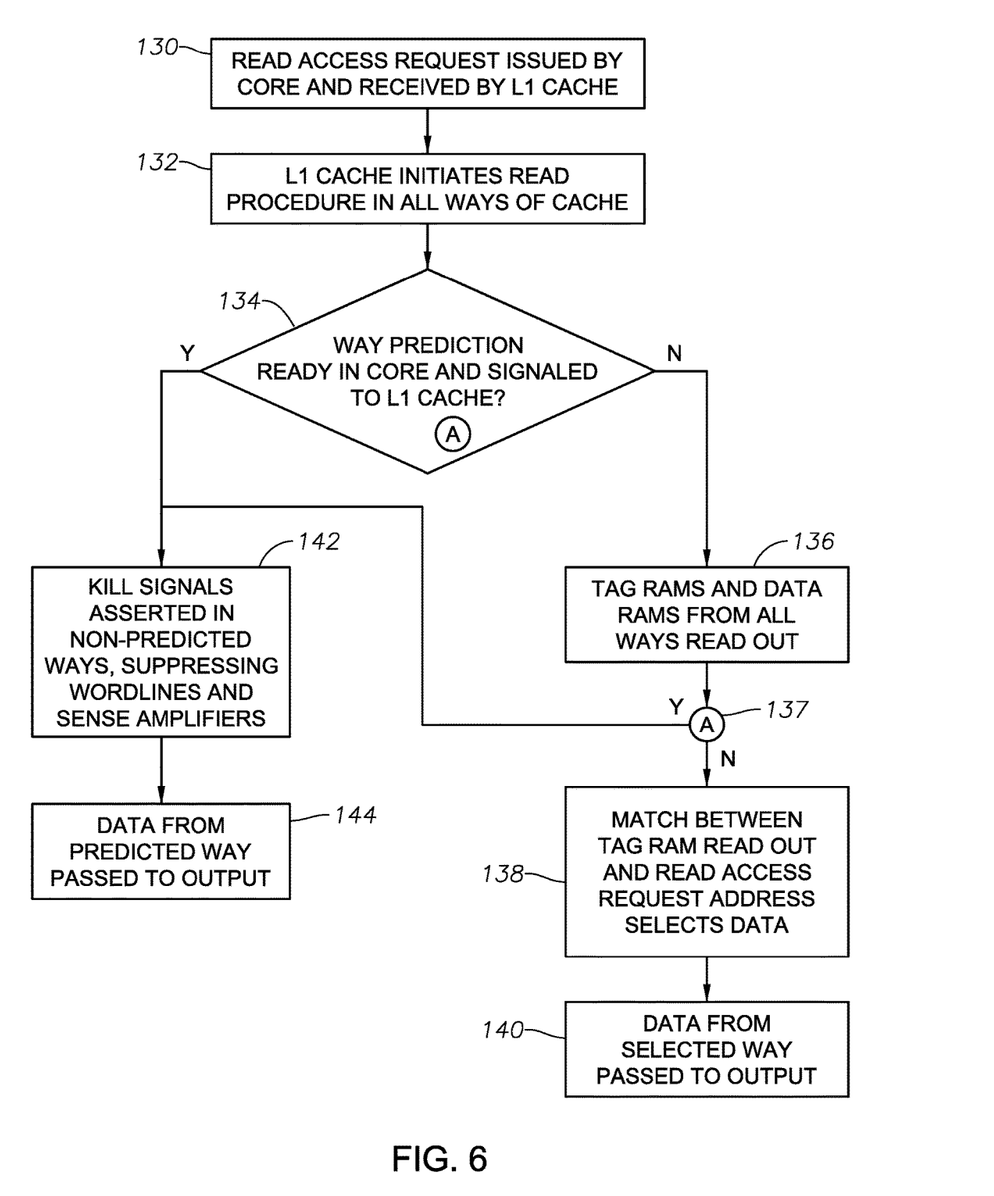
FIG. 6 shows a sequence of steps which are taken according to the method of one embodiment with respect to a received read access request.

FIG. 6 shows a sequence of steps which are taken in the method of one embodiment when a read access request is to be acted upon by the memory device. The read access request is issued by the core and received by a level 1 cache at step 130. Then at step 132 the level 1 cache initiates a read procedure in all ways of the cache. Next, at step 134, it is determined if the way prediction being carried out by the core has completed and has been signalled to the level 1 cache, i.e. if the late kill signal has been asserted. If it has not, then the flow proceeds to step 134 where the tag RAMs and data RAMs of all ways of the L1 cache are read out. The determination of step 134 (labelled "A") is again performed at the next step 137. In fact, this check for the assertion of the late kill signal is in fact continually carried out, with the consequence that the discrete steps 136 and 138 shown in FIG. 6 can in fact be aborted at any given moment, but for clarity of illustration they are illustrated as discrete steps with the check being performed prior to step 136 (at step 134) and prior to step 138 (at step 137). If the late kill signal is not asserted then at step 138 a match between the tag RAM entry read out and the read access request address determines the data item read out from the data RAMs to be provided as the output and at step 140 this is passed to the output latch for outputting is the final data value. If however at either step 134 or step 137 it is determined that the late kill signal has been asserted then the flow proceeds to step 142 where the kill signals are asserted in the "non-predicted" ways, suppressing the activation of the word lines and sense amplifiers in those ways. Finally at step 144 the data values from the predicted way (or from the remaining ways which were not "non-predicted", with the subsequent address match determining the one data value to output) is passed to the output latch for outputting as the final data value.

Figure 7:
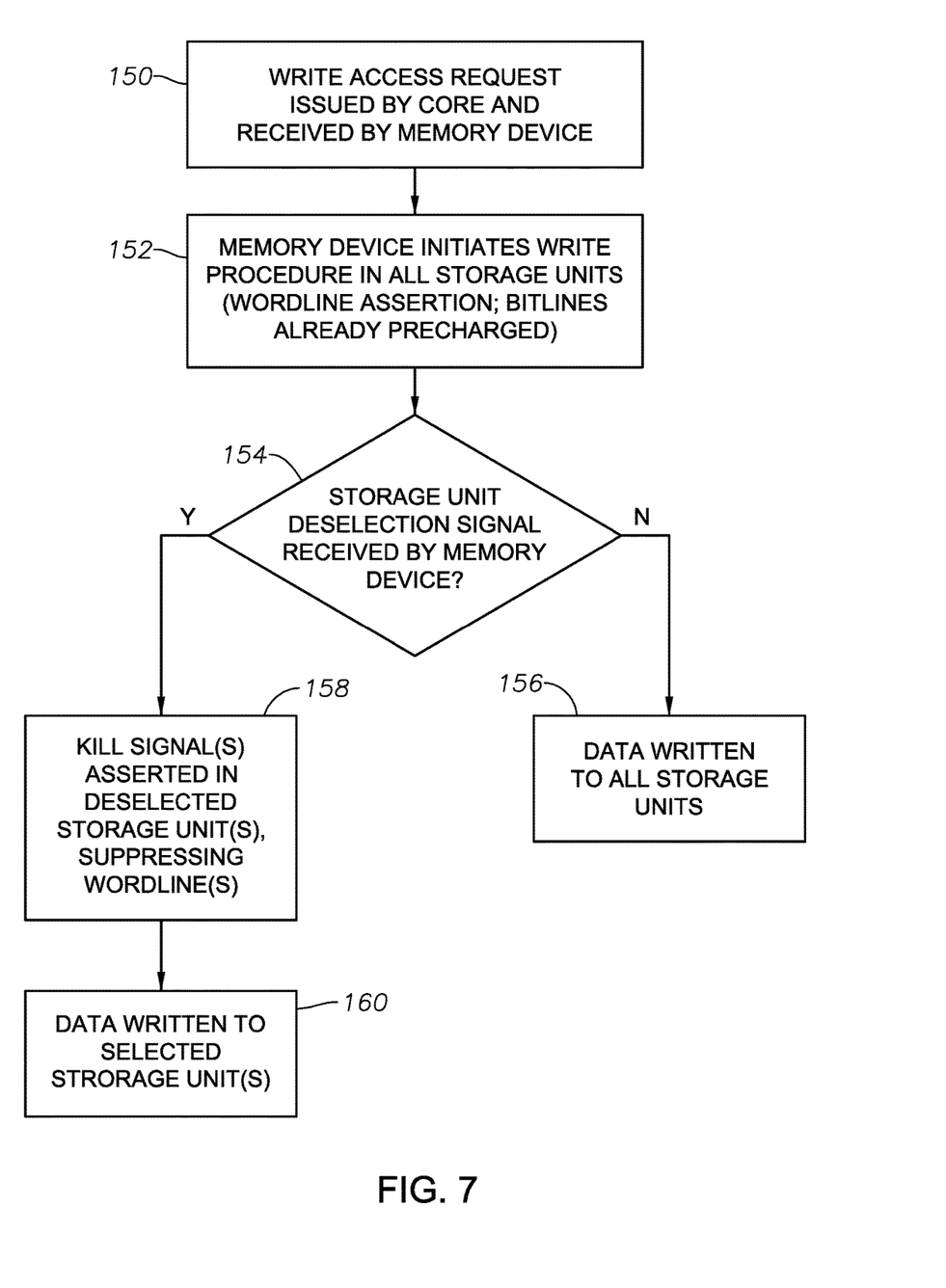
FIG. 7 shows a sequence of steps which are according to the method of one embodiment with respect to a received write access request.

FIG. 7 shows a sequence of steps which are taken in the method of one embodiment when a write access request is to be acted upon by the memory device. The write access request is issued by the core and received by the memory device at step 150. Then at step 152 the memory device initiates a write procedure in all storage units of the memory device. In other words, for full redundancy by default the data item will be written to all storage units of the memory device. Next, at step 154, it is determined if the late access kill signal, in this embodiment a storage unit deselection signal indicating at least one specific storage unit in which the write procedure should be suppressed, has been signalled to the memory device. If it has not, then the flow proceeds to step 156 where the data value received as part of the write access request is written to all storage units of the memory device. If however at step 154 it is determined that the late access kill signal has been signalled, then the flow proceeds to step 158, where the relevant kill signal(s) is/are asserted in the selected storage unit(s) which causes the assertion of the respective word line(s) in that/those selected storage unit(s) to be suppressed. As a consequence, at step 160, the data value is then only written to the remaining selected storage unit(s).

In brief overall summary therefore the present techniques provide a memory device and a method of operating the memory device. The memory device comprises a plurality of storage units and access control circuitry. The access control is configured to receive an access request and in response to the access request to initiate an access procedure in each of the plurality of storage units. The access control circuitry is configured to receive an access kill signal after the access procedure has been initiated and, in response to the access kill signal, to initiate an access suppression to suppress the access procedure in at least one of the plurality of storage units. Hence, by initiating the access procedures in all storage units in response to the access request the access latency, e.g. without waiting for a further indication of a specific storage unit in which to carry out the access procedure, the overall access time for the memory device kept low, but by enabling at least one of the access procedures later to be suppressed in response to the access kill signal dynamic power consumption of the memory device can be reduced.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

We claim:
1. A memory device comprising:
a plurality of storage units, wherein each of the plurality of storage units comprises a number of bitcells and wordline circuitry coupled to each of the bitcells;
wordline suppression circuitry; and access control circuitry configured to receive an access request and in response to the access request to initiate an access procedure in each of the plurality of storage units, wherein the wordline circuitry is configured to activate a selected wordline in response to the access request as part of the access procedure, wherein the access control circuitry is configured to receive an access kill signal after the access procedure has been initiated and prior to outputting requested data, wherein the access control circuitry is configured, in response to the access kill signal, to initiate an access suppression to suppress the access procedure in at least one of the plurality of storage units, and wherein the wordline suppression circuitry is configured to suppress the selected wordline in response to the access kill signal.

2. The memory device as claimed in claim 1, wherein the access control circuitry is configured, in response to the access kill signal, to initiate the access suppression to suppress the access procedure in the at least one of the plurality of storage units while allowing the access procedure in at least one other of the plurality of storage units.

3. The memory device as claimed in claim 2, wherein the wordline suppression circuitry is configured to connect the selected wordline to a fixed voltage in response to the access kill signal.

4. The memory device as claimed in claim 1, wherein each of the plurality of storage units comprises sense amplifier circuitry, and the memory device is configured to activate the sense amplifier circuitry in response to the access request to perform the access procedure, and the memory device further comprises sense amplifier suppression circuitry configured to suppress the sense amplifier circuitry in response to the access kill signal.

5. The memory device as claimed in claim 4, wherein the sense amplifier circuitry is configured to be activated when a sense amplifier enable signal is asserted, and the sense amplifier suppression circuitry is configured to connect the sense amplifier enable signal to a fixed voltage in response to the access kill signal.

6. The memory device as claimed in claim 1, wherein the memory device is a first-level cache provided in association with a data processor.

7. The memory device as claimed in claim 1, wherein the memory device is a multi-way set-associative cache and the plurality of storage units are a plurality of ways of the multi-way set-associative cache.

8. The memory device as claimed in claim 7, wherein each way of the plurality of ways comprises a tag storage unit and a data storage unit and the access control circuitry is configured to initiate the access suppression in at least one tag storage unit of the plurality of storage units.

9. The memory device as claimed in claim 7, wherein each way of the plurality of ways comprises a tag storage unit and a data storage unit and the access control circuitry is configured to initiate the access suppression in at least one data storage unit of the plurality of storage units.

10. The memory device as claimed in claim 1, wherein the access control circuitry is configured to generate an internal clock signal in each of the plurality of storage units to control timing of the access procedure, and the access control circuitry is configured to initiate the access suppression after a first edge of the internal clock signal has been generated.

11. The memory device as claimed in claim 1, wherein each of the plurality of storage units comprises bitline precharge circuitry, wherein the bit line precharge circuitry is configured to precharge bitlines in that storage unit before the access procedure is initiated, and the access procedure comprises discharging the bitlines, and the access control circuitry is configured to initiate the access suppression after discharging the bitlines has started.

12. The memory device as claimed in claim 1, wherein the access control circuitry is configured to receive a chip enable signal for the memory device, the access request comprises assertion of the chip enable signal and the access control circuitry is configured to initiate the access procedure in response to assertion of the chip enable signal.

13. The memory device as claimed in claim 7, wherein the access control circuitry is configured to receive, as the access kill signal, a way prediction signal indicating a subset of the ways, and the access control circuitry is configured to initiate the access suppression to suppress the access procedure in the subset of the ways indicated by the way prediction signal.

14. The memory device as claimed in claim 1, wherein the access control circuitry is configured to receive, as the access kill signal, a storage unit deselection signal indicating a subset of the plurality of storage units, and the access control circuitry is configured to initiate the access suppression to suppress the access procedure in the subset of the plurality of storage units indicated by the storage unit deselection signal.

15. The memory device as claimed in claim 1, wherein the access request is a read access request and the access procedure is a read access procedure.

16. The memory device as claimed in claim 1, wherein the access request is a write access request and the access procedure is a write access procedure.

17. A method of operating a memory device comprising:
storing data in a plurality of storage units, wherein each of the plurality of storage units comprises a number of bitcells and wordline circuitry coupled to each of the bitcells;
receiving an access request;
in response to the access request, initiating an access procedure in each of the plurality of storage units;
activating a selected wordline with the wordline circuitry in response to the access request as part of the access procedure;
receiving an access kill signal after the access procedure has been initiated and prior to outputting requested data;
in response to the access kill signal, suppressing the access procedure in at least one of the plurality of storage units; and
suppressing the selected wordline with wordline suppression circuitry in response to the access kill signal.

18. A memory device comprising:
a plurality of storage units for storing data, wherein each of the plurality of storage units comprises a number of bitcells and wordline circuitry coupled to each of the bitcells;
access control circuitry having a means for receiving an access request;
the access control circuitry having a means for, in response to the access request, initiating an access procedure in each of the plurality of storage units;
the wordline circuitry having means for activating a selected wordline in response to the access request as part of the access procedure;

the access control circuitry having a means for receiving an access kill signal after the access procedure has been initiated and prior to outputting requested data;

the access control circuitry having a means for, in response to the access kill signal, suppressing the access procedure in at least one of the plurality of storage units; and wordline suppression circuitry having a means for suppressing the selected wordline in response to the access kill signal.

19. The method of claim 17, further comprising, in response to the access kill signal, suppressing the access procedure in at least one of the plurality of storage units while allowing the access procedure in at least one other of the plurality of storage units.

20. The memory device of claim 18, wherein the access control circuitry further has a means for, in response to the access kill signal, suppressing the access procedure in at least one of the plurality of storage units while allowing the access procedure in at least one other of the plurality of storage units.

* * * * *

UNITED STATES PATENT AND TRADEMARK OFFICE
CERTIFICATE OF CORRECTION

PATENT NO. : 9,600,179 B2  
APPLICATION NO. : 14/446668  
DATED : March 21, 2017  
INVENTOR(S) : Chong et al.

Page 1 of 1

It is certified that error appears in the above-identified patent and that said Letters Patent is hereby corrected as shown below:

On the Title Page

Item (72) should read:  
Yew Keong Chong, Austin, TX (US);  
Michael Alan Filippo, Driftwood, TX (US);  
Gus Yeung, Austin, TX (US);  
Andy Wangkun Chen, Austin, TX (US);  
Sriram Thyagarajan, Austin, TX (US);  
Fakhruddin Ali Bohra, Austin, TX (US)

Signed and Sealed this  
Twenty-fourth Day of March, 2020

Andrei Iancu  
*Director of the United States Patent and Trademark Office*